United States Patent [19]

Walter et al.

[11] Patent Number: 4,806,409

[45] Date of Patent: Feb. 21, 1989

[54] PROCESS FOR PROVIDING AN IMPROVED ELECTROPLATED TAPE AUTOMATED BONDING TAPE AND THE PRODUCT PRODUCED THEREBY

[75] Inventors: Jackie A. Walter, Sunnyvale; Brett Sharenow, Mt. View; Robert Walker, Saratoga; Scott V. Voss, Portola Valley, all of Calif.

[73] Assignee: Olin Corporation, New Haven, Conn.

[21] Appl. No.: 51,783

[22] Filed: May 20, 1987

[51] Int. Cl.[4] ................... B32B 3/10; H01R 43/00
[52] U.S. Cl. .................... 428/138; 29/827; 174/52.4; 357/70; 428/209; 428/901
[58] Field of Search .............. 29/827; 174/52 FP; 357/70; 428/601, 138, 209, 458, 901

[56] References Cited

U.S. PATENT DOCUMENTS

| | | | |
|---|---|---|---|
| 3,440,027 | 4/1969 | Hugle | 29/827 X |
| 3,611,061 | 10/1971 | Segerson | 174/52 FP X |
| 3,773,628 | 11/1973 | Misawa et al. | 174/52 FP X |
| 4,049,903 | 9/1977 | Kobler . | |
| 4,407,440 | 10/1983 | Manning . | |
| 4,411,982 | 10/1983 | Shibuya et al. . | |
| 4,466,183 | 8/1984 | Burns | 29/827 |
| 4,472,876 | 9/1984 | Nelson . | |
| 4,510,017 | 4/1985 | Barber . | |
| 4,607,276 | 8/1986 | Butt . | |
| 4,635,092 | 1/1987 | Verman et al. | 357/70 X |
| 4,701,363 | 10/1987 | Barber | 29/827 X |
| 4,721,993 | 1/1988 | Walter . | |
| 4,735,678 | 4/1988 | Mandigo et al. . | |
| 4,736,236 | 4/1988 | Butt . | |
| 4,736,882 | 4/1988 | Winter et al. . | |

FOREIGN PATENT DOCUMENTS

| | | | |
|---|---|---|---|
| 253252 | 12/1985 | Japan | 29/827 |
| 61-90453 | 5/1986 | Japan | 357/70 |

OTHER PUBLICATIONS

"TAB Technology Tackles High Density Interconnections" by Tom Dixon, Dec. 1984, vol. of *Electronic Packaging & Production*, pp. 34–39.

Primary Examiner—Carl J. Arbes
Attorney, Agent, or Firm—Gregory S. Rosenblatt; Paul Weinstein

[57] ABSTRACT

A flexible tape having a desired metal foil circuit pattern and a process for manufacturing such a tape. The starting tape comprises a non-metallic flexible substrate having a metal foil layer adhered thereto. The foil layer is patterned to form a desired circuit pattern and a pattern comprising bussing means. The foil is electroplated by connection of the electroplating circuitry to the bussing means. Thereafter, the tape is reduced in width by removing the bussing means and the underlying flexible substrate.

16 Claims, 3 Drawing Sheets

PROCESS FOR PROVIDING AN IMPROVED ELECTROPLATED TAPE AUTOMATED BONDING TAPE AND THE PRODUCT PRODUCED THEREBY

This invention relates to a process for manufacturing tape for use in tape automated bonding (hereinafter referred to as TAB). A general review of TAB technology is set forth in an article entitled "TAB Technology Tackles High Density Interconnections" by Tom Dixon, which appeared in the December, 1984, volume of *Electronic Packaging & Production* at pages 34-39. TAB technology comprises an interconnect technology used to interconnect a semiconductor device to a leadframe, semiconductor package contacts or printed circuit board. In most cases, TAB is used instead of conventional wire bonding technology. TAB is finding increased use commercially because of the trend toward increased circuit density. TAB permits closer spacing of interconnect bonding pads on the semiconductor die than would be achievable by wire bonding. One of the significant advantages of TAB is that certain TAB constructions permit device testing and burn in prior to mounting in a package or on a substrate. This permits culling of bad devices prior to their incorporation into expensive circuits and packages.

There are three general forms of TAB construction. The first is a single layer or all metal construction; the second is a two layer construction comprising a metal layer with a dielectric backing such as a polyimide; and the third is a three layer construction comprising a metal layer adhesively bonded to a dielectric such as KAPTON polyimide. Further details concerning these respective constructions can be obtained from a review of the aforenoted Dixon article.

A TAB interconnect generally comprises a plurality of narrow leads arranged to extend outwardly from a semiconductor die such that the inner lead portions are adapted to be bonded to the semiconductor die contact pads and the outer lead portions are adapted to bond to a leadframe, circuit board, etc., as desired. In the single layer version, a metal frame supports the elongated leads; whereas, in the two or three layer versions, a polyimide substrate supports the leads.

The TAB process involves first bonding the inner lead portions of the TAB tape to the semiconductor device followed by excising the leads from the tape frame or support substrate and then bonding the outer lead portions to the desired leadframe, package circuitry or printed circuitry, as desired. The TAB leads are formed from a metal foil such as copper foil and are relatively thin, namely one to four mils thick. The thinness of the TAB foil permits the interconnects to be placed more closely together thereby allowing high density interconnection at the semiconductor chip.

TAB tapes may be bumped or unbumped. The bumps act in part as mechanical standoffs from the chip. Unbumped tapes require that the semiconductor chips be bumped in order to make the desired thermocompression bond between the inner lead portion of the TAB leads and the chip. Bumped tapes eliminate the need for bumping of the wafer and, therefore, permit the TAB interlead bond portions to be bonded directly to ordinary semiconductor die bonding pads. The bumped tape normally has a copper projection or bump positioned at the point where it is to be joined to the die. The bumped or unbumped TAB leads may, if desired, be covered with a suitable plating such as gold, tin or nickel.

In typical state of the art tape automated bonding tapes for semiconductor interconnection, the leads are plated by either electroless or electrolytic processes. Preferably, electrolytic processes are used in order to obtain a high reliability plating. Such processes are more controllable then electroless processes. For two or three layer tapes electroplating requires that all of the TAB leads be electrically connected to a common bussing structure. Of course, single layer TAB tapes use a metal frame to support the leads and, therefore, the leads are electrically interconnected and can be readily electroplated. The present invention is not directed to single layer metal tapes but rather it is directed to TAB tapes wherein the metal layer is supported on an insulating substrate such as a polyimide.

In typical prior art approaches, each of the leads is connected by a portion of the foil conductor to a common bus for electroplating. The common buss areas are punched out in order to de-short or isolate the leads from one another to allow a complete test (and burn-in, if desired) of the semiconductor chip bonded to the tape format. These prior art approaches are subject to a number of significant problems and extra processing. Punching out sections of the TAB support structure to de-short the bussing structure causes the tape to become less structurally sound. The punching operation can damage the fragile cantilevered leads of the tape. Where the tape has been bonded to the chip, the punching can also stress the bonds. The bussing structure, which remains on the TAB tape, takes a significant amount of plating material, which traditionally is a precious metal, thereby increasing the price of the final tape product.

In accordance with the present invention, a novel bussing methodology is provided for electroplating tape automated bonding tapes. The novel bussing comprises locating the buss structure outside the standard TAB tape format width. For example, to produce a TAB tape product of a desired transverse width, the initial transverse tape width during manufacture is made wider. This provides two excess longitudinally extending strips at the opposing edges of the TAB tape for supporting generally parallel electrical buss bars for interconnecting the leads for electroplating. The electrical busses are located in close proximity to the opposing edges of the tape to minimize the amount of excess material. Preferably, they are within about 0.1" of the edges and, most preferably, within about 0.07".

Presently most TAB tapes employ a plurality of sprockets extending longitudinally near the edges of the tape in two opposing rows. In accordance with the present invention, the busses are preferably arranged outwardly of the sprockets in a transverse sense so that after the electroplating operation is completed the excess longitudinal strips of the TAB tape containing the busses can be removed by slitting or other desired technique.

By removing the bussing structures which are located outside the tape format active area, they are not included in the product which is ultimately sold to the customer. Therefore, any precious metal value associated with the bussing structures can be recovered at least in part by conventional reclaiming procedures.

In the approach of this invention, the TAB tape provided to the customer does not include any shorting of the leads. Consequently, shorting bars or pads do not have to be removed, as by punching prior to testing of the electronic device bonded to the tape interconnect. This provides a significant number of advantages over the prior art processes previously described. The extra punching step with its potential damage to the TAB tape is eliminated. The TAB tape supplied to the customer remains structurally sound since no material is removed from the active area. Therefore, handling damage is kept to a minimum. Cost of the tape is lower since much of the precious metal value in the buss structure can be recovered. The TAB tape of the present invention permits wider circuit areas for a given width of tape since the circuit areas can now utilize that portion of the tape previously reserved for bussing structures. If desired, some leads can still be shorted together for electrostatic discharge protection by appropriately configuring the TAB circuitry. No stresses are applied to the tape or chip bond since the punching operation is eliminated.

Accordingly, it is an aim of the present invention to provide an improved process for manufacturing testable TAB tape having an electroplated coating.

It is a further aim of the invention to provide a testable TAB tape formed by the aforenoted process.

It is a yet further aim of the present invention to provide a testable TAB tape adapted for electroplating wherein the bussing structures for shorting out the leads are located outside the active format area of the TAB tape.

These and other objects will become more apparent from the following description and drawings wherein similar elements have been given corresponding or primed reference numbers.

Figure 1:
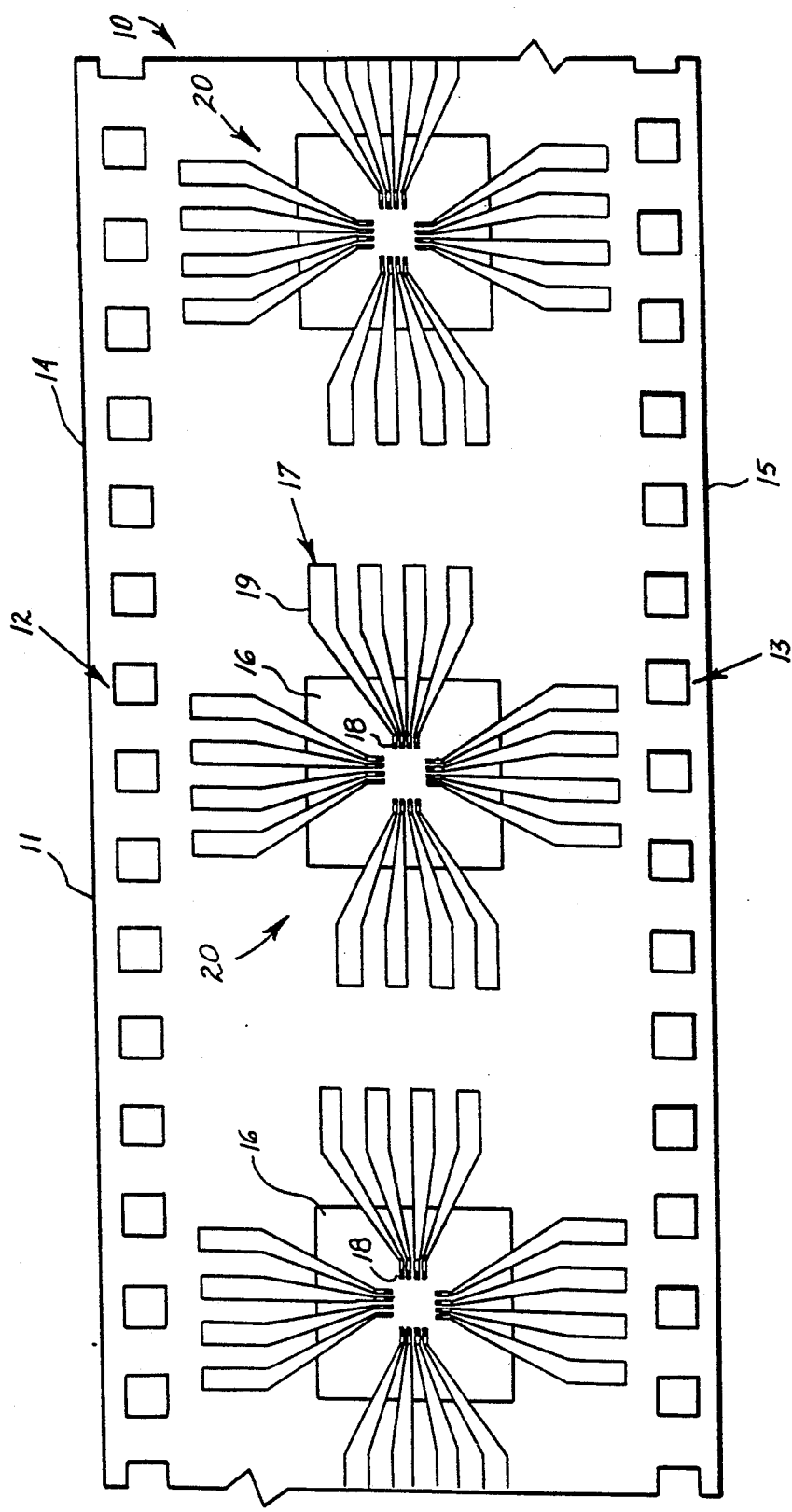
FIG. 1 is a top view of a testable TAB tape in accordance with the prior art.

Referring now to FIG. 1, there is shown by way of example a testable multi-layer TAB tape 10 in accordance with the prior art. The tape 10 could be a two layer tape wherein a metal foil layer is directly adhered to a nonmetallic flexible substrate or a three layer tape wherein the foil is adhered to the substrate by means of an adhesive. In the embodiment of FIG. 1, a three layer tape is shown.

The tape 10 is comprised of a nonmetallic flexible substrate 11 which is preferably formed of a polyimide, such as KAPTON. The substrate 11 preferably includes two rows of sprocket holes 12 and 13 extending longitudinally adjacent opposing longitudinal edges 14 and 15 of the substrate 11. The use of such sprocket holes in TAB type tapes is conventional and permits operations on the tape to be properly registered by reference to the sprocket holes. Other means for providing such registration could be used, if desired. The substrate 11 also includes a plurality of apertures 16 generally centrally located between the edges 14 and 15 and spaced apart longitudinally along the length of the tape.

A plurality of metal foil leads 17, normally copper foil although they could be other metals as desired, are supported by the substrate 11. The leads 17 are arranged on the substrate 11 so that the inner lead portions 18 extend in cantilever fashion into the aperture 16. The apertures 16 shown are square in shape, however, they may have any desired shape. The leads 17 are normally arranged about the entire aperture 16 periphery in order to obtain the high lead counts required. The lead count is the total number of leads extending into the aperture 16. The inner lead bond portions 18, which are adapted to attach to the semiconductor chip, are at one end of the lead 17. The opposing end portions 19 are attached to the substrate 11. The leads 17 surrounding a given aperture 16 comprise a pattern of interconnect leads 20. The outer lead bond portions 21 are adapted to attach to the semiconductor package leadframe, etc. after the leads 17 are excised within the aperture 16.

As shown in FIG. 1, a TAB tape is usually prepared with a plurality of spaced apart interconnect patterns 20 arranged serially or longitudinally along the length of the tape. Each pattern 20 of interconnect leads is adapted to connect a semiconductor device to a leadframe or other type of semiconductor package electrical connection system or in some cases, the foil leads 17 can extend outwardly of the package and connect directly to a circuit such as a printed circuit board. In accordance with TAB technology, the lead count can vary, as desired, for a particular application. For example, sixteen leads can be arranged, four on each side of the aperture 16, as shown or as many as several hundred can be employed. It is a feature of TAB technology that the thinness of the foil lead 17 permits them to be closely spaced together and to be relatively narrow in stature.

The structure which has been defined thus far can be fabricated by a number of prior art techniques as illustrated by reference to the following U.S. Pat. No. 4,049,903 to Kobler, U.S. Pat. No. 4,411,982 to Shibuya et al., U.S. Pat. No. 4,472,876 to Nelson and U.S. Pat. No. 4,510,017 to Barber. The starting material for the TAB tape 10 can comprise a two layer tape or a three layer tape as previously described. The three layer tape is comprised of a metal foil layer which is patterned into leads 17. The unpatterned foil layer (not shown) extends longitudinally on the flexible substrate 11 between the rows of sprocket holes 12 and 13. The transverse width of the foil layer is shown in FIG. 1 by the transverse width of the opposing transverse leads 17. The foil 17 is typically a copper foil but could comprise any other desired metal or alloy such as aluminum. An adhesive layer (not shown) adheres or bonds the foil onto the flexible substrate 11. The adhesive layer is coextensive with the unpatterned foil layer except that there is no adhesive in the aperture region.

The starting material as just described is coated with a suitable photoresist material such as AZ1195 photoresist sold by Shipley Company of Newton, Mass. In accordance with this invention any desired etch resist could be employed as well as any desired method for patterning the etch resist. The use of photoetching techniques are well-known in the art and comprise a simple and accurate approach for patterning the photoresist and foil layer. The photoresist layer may be applied to the tape by any desired technique including coating, as by spraying, immersion, etc. or laminating as well as other techniques as are known in the art. The photoresist layer preferably consists of a light sensitive resin which is photodegradable. A pattern mask (not shown) defining the interconnect lead pattern 20 is placed over the photoresist layer. On light exposure only the unmasked portions of the photoresist layer get exposed. The mask is then removed and the resist is developed.

The pattern in the mask (not shown) and the resist pattern generally correspond. A suitable mask for forming a resist pattern can be fabricated by conventional and well-known techniques.

Depending on whether a positive or a negative photoresist is employed, the exposed or unexposed portions of the photoresist layer are removed by conventional techniques such as immersion in a bath of AZ303 developer available from Shipley Company, Newton, Mass. This leaves a resist pattern which defines the interconnect leads 17. The photoresist pattern defining the leads is adapted to substantially resist etching of the underlying metal layer.

Thereafter, the tape 10 is subjected to etching in a conventional etchant such as ammoniacal cupric chloride, such as ACCUGUARD etchant available from Olin Hunt Chemical Corporation of West Patterson, N.J., although any desired etchant could be employed. During the etching step, the foil layer is etched in the regions not covered by the photoresist to form the lead pattern 20 comprising a plurality of interconnect leads 17 corresponding to the resist pattern.

Figure 2:
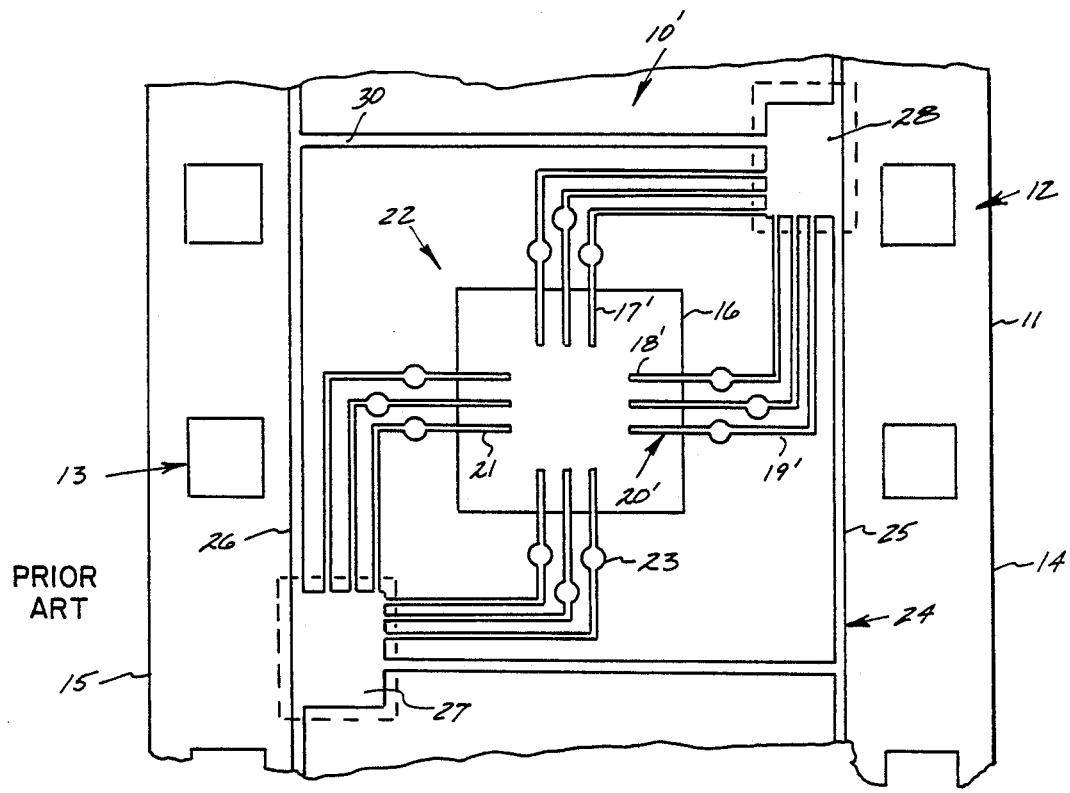
FIG. 2 is a top view of a testable TAB tape in accordance with the prior art including common buss areas adapted to be punched out for de-shorting.

Referring now to FIG. 2, a portion of a TAB interconnect tape 10' comprising a single tape frame 22 is shown. The TAB tape 10' shown in FIG. 2 includes a single pattern 20' of interconnect leads 17'. In these embodiments, only three leads 17' are shown about each side of the aperture 16, although any number of leads could be employed, as previously described. The leads 17' extend in cantilever fashion over the aperture 16. The opposing portions of the leads 19' are supported by the flexible substrate 11 and preferably include generally circular test pads 23 which are used for a test socket or probing point contact for testing a semiconductor device after it has been bonded to the leads 17'. The leads 17' are shown as being straight but they could have any desired shape as are known in the art. They can also include stress relieving means as are known in the art.

It is desired as a step in the fabrication of the TAB tape 10' to be able to plate the leads 17' with a desired metal such as tin, silver, gold etc. The purpose of the plating is to facilitate bonding of the inner lead portions 18' to a semiconductor device and of the outer lead portions 21 to a leadframe or other interconnect of a package for a semiconductor device or even to a printed circuit board directly.

As previously described, in order to achieve plating of the leads it is necessary that they be electrically interconnected. This is achieved by a conventional bussing arrangement 24. In FIG. 2, there is shown a common tie point methodology for bussing. In the embodiment of FIG. 2, there are two longitudinally extending conductive foil buss strips 25 and 26. The buss strips 25 and 26 are generally parallel to one another and are located closely adjacent to and between the respective rows of sprockets 12 and 13. The lead 17' are shorted out or connected to the busses 25 and 26 by means of tie pads 27 or 28. In FIG. 2, there are also shown transverse busses 29 and 30 extending from respective tie pads 27 and 28 to the opposing longitudinal busses 25 and 26.

The purpose of the transverse busses is to insure proper electrical continuity in the unlikely event that one of the longitudinal busses 25 or 26 became open due to damange or mishandling.

In operation, the inner lead portion 18' of the lead 17' would be bonded to the appropriate contact pads on a semiconductor device. Following the bonding operation, it is desired to be able to test the semiconductor device, to make sure that the leads are properly bonded and to ensure that the device itself has not been damaged in the bonding operation. The tie pads 27 and 28 short out all of the leads 17' and therefore the device cannot be tested with the leads connected to the tie pads. Therefore, it is conventional to excise the tie pads 27 and 28, as for example, by punching, to remove the pad and the underlying flexible substrate in the areas shown in phantom. When the pads 27 and 28 are thus removed, the leads 17' are no longer shorted out. Therefore the semiconductor device bonded to the leads 17' can be tested, as for example, by the use of probes contacting the test pads 23 in each of the leads.

The problems with this prior art approach have already been fully described and in particular, they involve the potential damage to the semiconductor device and the lead bonds by the punching operation, the loss of excess precious metal plating on the bussing structure and the loss of mechanical strength due to removal of portions of the underlying flexible substrate 11 which is used to support the leads 17'.

Figure 3:
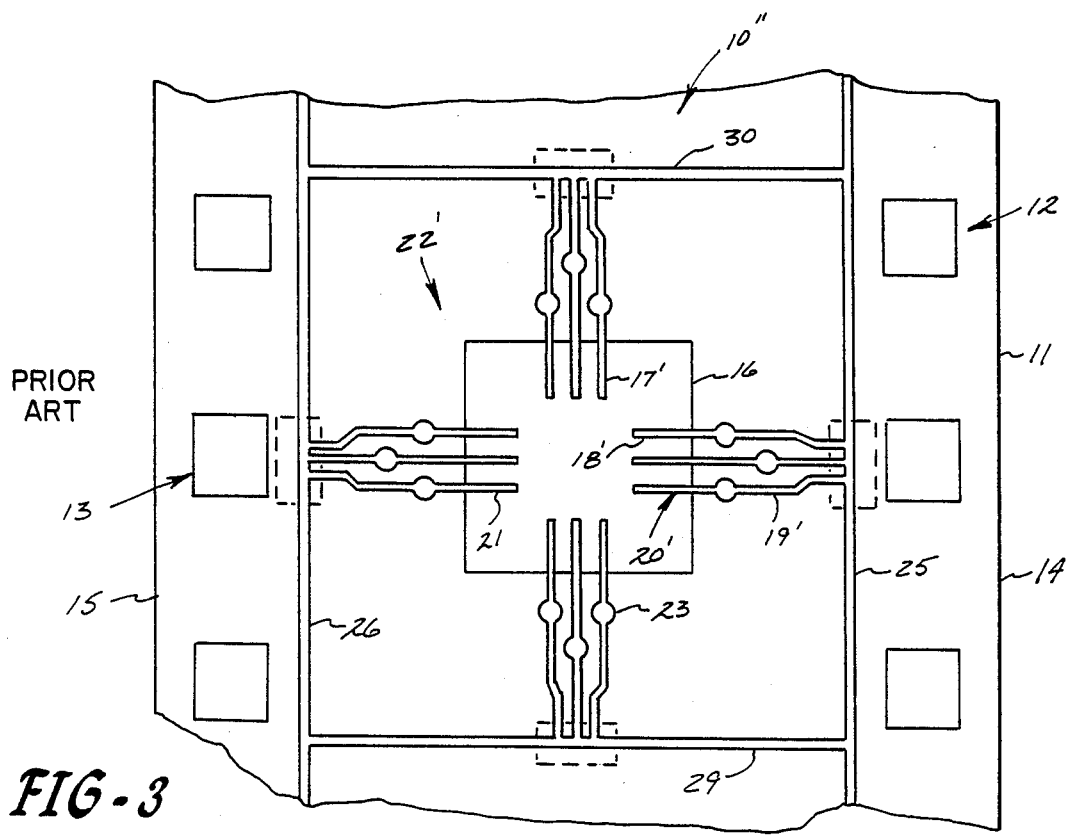
FIG. 3 is a top view of a testable bumped tape in accordance with the prior art which also includes common buss bars running down both sides of the tape with the leads being brought into close proximity at the buss bar interconnect area to allow ease of punching for de-shorting the leads.

Yet another prior art bussing approach is shown in FIG. 3. For purposes of simplicity, only the differences between the approach of FIG. 3 and that of FIG. 2 will be described. Elements with corresponding reference numbers are essentially the same as those described by reference to FIG. 2. The principle difference between the tape frame 22' shown in FIG. 3 and the tape frame 22 in FIG. 2 is the omission of the tie pads 27 and 28 from the embodiment of FIG. 3. In place of the tie pads, the leads 17' extend from the aperture 16 directly to a respective buss 25, 26, 29 or 30 closest thereto. Accordingly, the leads 17' which extend tranversely of the tape 10" are connected to the longitudinally extending busses 25 and 26, whereas the leads 17' extending longitudinally of the tape 10" are electrically connected to the transverse busses 29 and 30. The advantage of this approach over that shown in FIG. 2, is that the foil traces 19 connecting the lead 17' to the respective busses 25, 26, 29 and 30 are much shorter, therefore saving precious metal plating costs. However, this approach requires punching four holes in the tape, as shown in phantom, in order to sever the portion of the busses 25, 26, 29 and 30 which serve to short out the leads 17'. Therefore, this approach is subject to the same deficiencies as the previous approach, although it is somewhat more cost effective because of the shorter lead traces 19.

Figure 4:
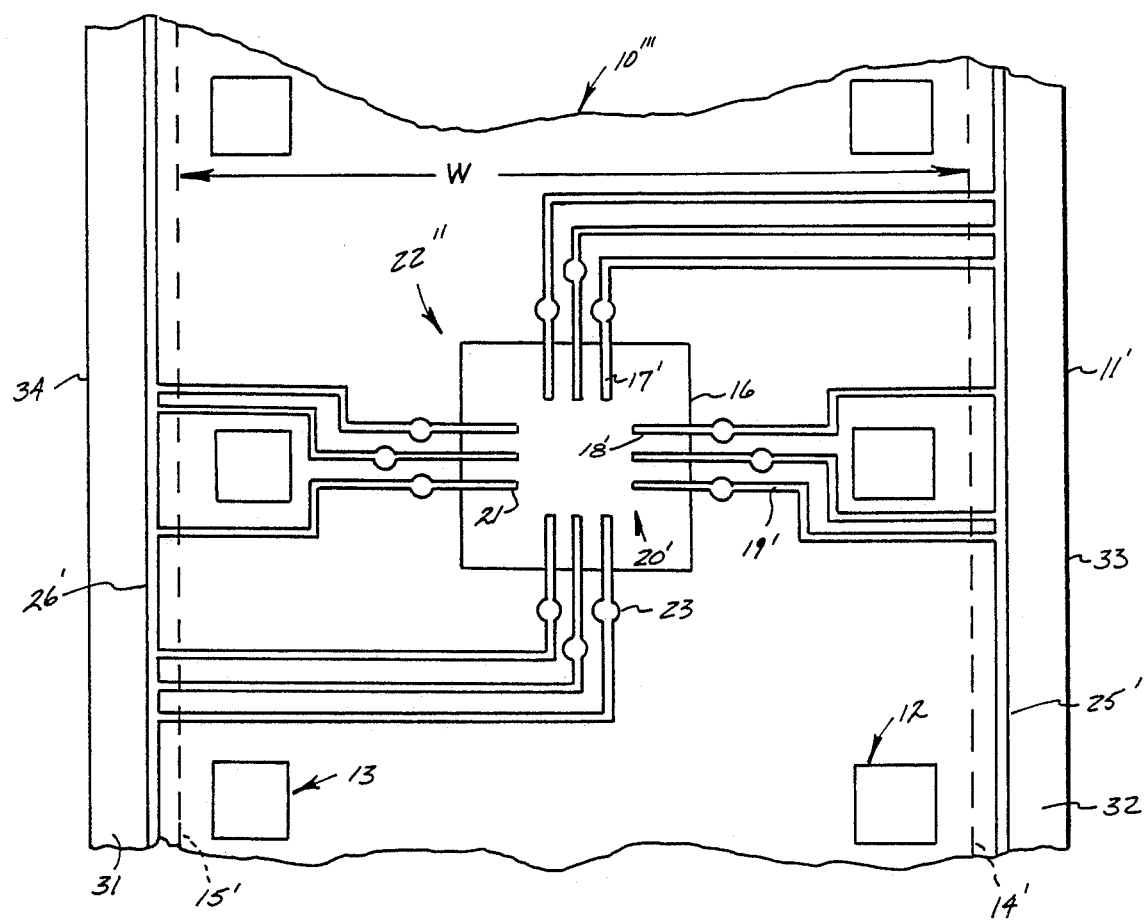
FIG. 4 is a top view of a testable bumped tape in accordance with the present invention including the novel bussing structure.

Referring now to FIG. 4, a tab tape 10''' in accordance with the present invention will be described. The tab tape 10''' overcomes the significant problems associated with the prior art bussing approaches illustrated in FIGS. 2 and 3. As with the discussion of the previous embodiments, corresponding elements have been given similar or primed reference numbers and therefore may not be discussed in detail in reference to FIG. 4. The principal difference between the embodiment of FIG. 4 and those previously described is that the flexible substrate 11' is wider than the substrate 11 in the previously described embodiments. The width W of the previously described tape is shown in phantom.

In accordance with this invention, a novel bussing methodology is provided for electroplating tape automated bonding tapes 10'''. The novel bussing comprises locating longitudinal busses 25' and 26' outside the standard TAB tape format width W which is the width between the phantom lines 14' and 15'. For example, to produce a TAB tape product of a desired width W the initial transverse substrate 11' width during manufacture is made wider. This provides two excess longitudinally extending strips 31 and 32 defined between the respective outer opposing edges 33 and 34 of the substrate 11' and the desired tape edges 14' and 15' shown in phantom. The strips 31 and 32 are adapted to support generally parallel electrical buss bars 25' and 26' for interconnecting the leads 17' for electroplating. The foil busses 25' and 26' are located in close proximity to the edges 33 and 34 of the tape substrate 11' to minimize the amount of excess material 31 and 32. Preferably, they are within about 0.1 inches of the edges 33 and 34 and most preferably within about 0.07 inches.

The leads 17' are then connected by foil traces 19' to one of the opposing busses 25' or 26'. While these leads 17' and their traces 19' are somewhat longer than in the previously discussed embodiments, they involve small amounts of material since they are relatively narrow in extent as compared to the busses which are relatively wide. For example, a typical buss is generally from about 2 to about 10 times as wide as a typical lead trace 19'. Therefore, less precious metal plating is used in the lead traces 19' than in the busses 25' and 26'.

In the embodiment of FIG. 4, two rows of sprockets are employed 12 and 13 as in the previously described embodiment. The rows extend longitudinally of the tape and are arranged near the edges 33 and 34 thereof, although not as closely adjacent as in the previously described embodiment. In accordance with this invention, the busses 25' and 26' are arranged outwardly of the sprockets in a transverse sense so that after the electroplating operation is completed the excess strips 31 and 32 containing the busses 25' and 26' can be removed by slitting or other desired technique.

Figure 5:
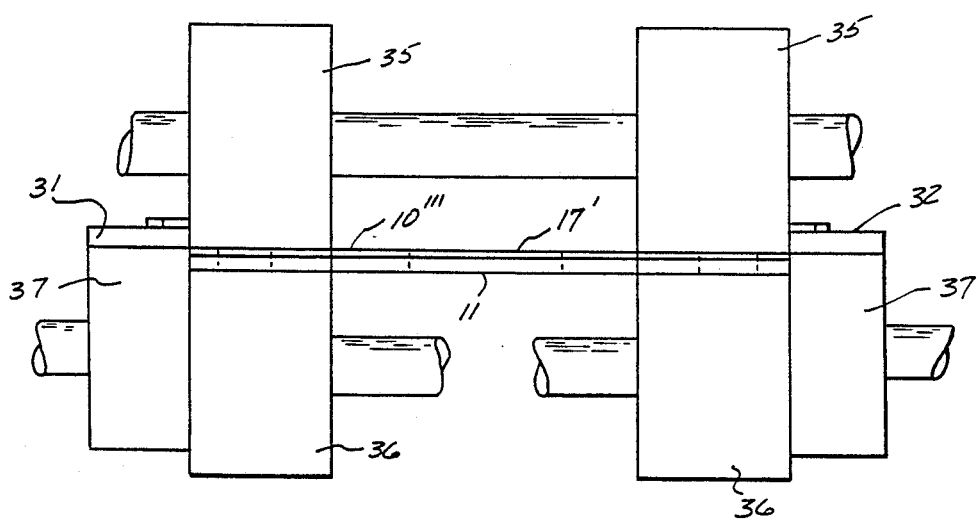
FIG. 5 is a front view of a slitting apparatus for removing the bussing structures from the TAB tape.

The slitting operation may be accomplished as shown in FIG. 5, or by any other desired means. In FIG. 5, the tab tape 10''' is supported between opposing pinch rolls or knives 35 and 36. This insures that there will be no damage to the tape when the strips 31 and 32 are removed therefrom by the action of slitting knives 37. FIG. 5 is intended only to be schematic of a slitting apparatus and any desired slitting apparatus could be used. The rolls or knives 35 and 36 and the slitting knives 37 would be supported in a frame (not shown) and suitably journaled and powered. The tab tape 10''' would be fed through the apparatus so that the strip 31 and 32 are removed along with their associated busses 25' and 26'.

Alternatively, other conventional slitting systems could be employed and if desired, other forms of cutting the strips could be used, as for example, laser cutting. Further, if desired, the boundaries 14' and 15' could comprises perforations small enough so that they would not open the short between a lead trace 19' and a buss 25' or 26'. If the boundaries 14' and 15' were perforated then the excess strips 31 and 32 could be easily removed by peeling them away from the active body of the tab tape 10'''. Any desired form of perforations could be used. In practice, however, it is believed that the slitting approach would be most useful.

By removing the bussing structures 25' and 26' which are located outside the tape format active area, they are not included in the product which is ultimately sold to the customer. Therefore, any precious metal value associated with the bussing structures which are large as compared to the lead traces 19' can be recovered at least in part by conventional reclaiming procedures.

Since the TAB tape provided to the customer does not include any shorting of the leads, it is not necessary to remove shorting bars or pads as in the prior art before testing of the electronic device bonded to the tape interconnect 10'''. This provides a significant number of advantages over the prior art approaches described by reference to FIGS. 1 through 3. The extra punching step with its potential damage to the TAB tape is eliminated. The TAB tape supplied to the customer remains structurally sound since no material is removed from the active area. Handling damage is kept to a minimum. Cost of the tape should be lower since much of the precious metal value in the buss structure can be recovered. It is possible with the buss approach of this invention to provide wider circuit patterns in the active area of the tape between the boundaries 15' and 14' since the circuit areas can now utilize that portion of the tape previously reserved for bussing. The approach of the present invention does not apply stresses to the tape to semiconductor device bonds since the punching operation is eliminated.

In the embodiment of FIG. 4, the rows of sprocket holes 12 and 13 have been included in the conventional fashion. It is believed however, that sprocket holes may not be required in future TAB tapes. Accordingly, the presence or absence of sprocket holes does not form an essential part of this invention. If no sprocket holes are present, there will be other indicia used as a basis for pattern recognition in order to properly register the tape. In the absence of sprockets, it is desirable in accordance with this invention to locate the busses 25' and 26' as closely adjacent to the edges 33 and 34 of the starting tape as possible and certainly within the limits which have been described. The reason for this is to minimize the excess material which will have to be removed.

While the invention has been described by reference to tape automated bonding tapes for interconnecting electronic devices it is also applicable to flexible tapes having any desired metal foil circuit pattern thereon. In other words, the technology which has been described can be used for making TAB tapes or flexible foil circuits of any desired type in tape form. In the case of a flexible foil circuit, the foil would be supported on a non-metallic flexible substrate just as in the case of the TAB circuit, however, the circuit pattern need not be of the type described by reference to a TAB format. Further, such tapes may not include apertures 16 but can include one or more other types of holes or apertures.

While the TAB tape of this invention has been described by reference to two layer or three layer tape, if desired, additional layers could be included, as for example, the use of a foil layer adhered to both sides of the non-metallic flexible substrate.

While the invention has been described by reference to the use of two opposing longitudinal busses 25' and 26', only one such longitudinal bus is required and the invention is applicable to TAB tapes or tape circuits with any desired number of longitudinal busses. Further, though not required, the TAB tape or flexible circuit tape can include, if desired, tranverse busses and described by reference to the embodiments of FIGS. 2 and 3.

The metal which is electroplated can be any desired metal or alloy. During electroplating by any desired conventional means, the foil busses may be electrically connected to the electrodeposited circuits by any conventional means as desired, eg., roll contacts.

The particular process for electroplating does not form part of the present invention. The electroplating may be carried out in a batch mode wherein strips of tape are held on a rack which is immersed in the electrolyte in order to plate the desired metal. The rack is electrically connected in the electrolytic circuit and the busses of each strip are electrically connected to the rack through the use of clips or other clamping devices. Alternatively, the plating may be carried out on a reel-to-reel basis wherein sliding or rolling contacts are used to electrically connect the busses into the plating circuit. Technology for plating various metals is disclosed in *Electroplating Technology Recent Developments* by J. I. Duffey, published by Noyes, Data Corporation, Park Ridge, N.J. in 1981. For plating a material such as gold, a conventional cyanide bath can be employed.

The patents and publications set forth in this application are intended to be incorporated in their entireties by reference herein.

It is apparent that there has been provided in accordance with this invention a process for providing an improved electroplated tape automated bonding tape and the product produced thereby which satisfy the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and all varitions as fall within the spirit and broad scope of the appended claims.

We claim:

1. A flexible tape having a desired metal foil circuit pattern thereon comprising:
   an indexing means;
   a non-metallic flexible substrate having at least one metal foil layer adhered thereto;
   said foil layer being patterned to form a first desired circuit pattern and a second pattern comprising bussing means for electrical connection to said circuit pattern during electrodeposition, said bussing means including at least one longitudinally extending foil buss, said longitudinally extending buss being located between said indexing means and an outer longitudinally extending edge of said substrate.

2. A flexible tape as in claim 1 wherein a longitudinally extending foil buss is arranged closely adjacent to each longitudinal edge of said substrate.

3. A flexible tape as in claim 1 wherein said circuit pattern comprises a tape automated bonding format for connecting an electronic device to a leadframe, or electronic package contacts, or a printed circuit board.

4. A flexible tape as in claim 3 wherein said tape includes a plurality of said tape automated bonding format circuit patterns arranged in spaced-apart fashion longitudinally of said tape.

5. A flexible tape as in claim 1 wherein said longitudinally extending buss is within about 0.1 inches of said outer longitudinally extending edge of said substrate.

6. A flexible tape having a tape automated bonding format for connection of an electronic device to a leadframe, electronic package contacts or printed circuit board, comprising:
   a non-metallic flexible substrate having at least one metal foil layer adhered thereto;
   said foil layer being patterned to form a plurality of first desired circuit patterns arranged in spaced-apart fashion longitudinally along said tape, said first pattern including a plurality of leads extending in cantilever fashion over an aperture in said non-metallic flexible substrate each said lead further including a foil trace shorting said lead to said foil buss, and at least one second pattern comprising bussing means for electrical connection to said circuit pattern during electrodeposition, said bussing means including at least one longitudinally extending foil buss, within about 0.1 inches of an outer longitudinally extending edge of said substrate.

7. A flexible tape as in claim 6 wherein said tape further comprises at least one row of sprockets arranged adjacent said longitudinal edge of said substrate and wherein said longitudinally extending buss is located between said row of sprockets and said longitudinally extending edge of said substrate.

8. A flexible tape as in claim 7 wherein a row of said sprockets is located adjacent each outer longitudinally extending edge of said substrate and wherein a longitudinally extending foil buss is located between each such edge of said substrate and its adjacent row of said sprockets.

9. A process for manufacturing a flexible tape having a desired metal foil circuit pattern thereon;
   providing a starting tape comprising a non-metallic flexible substrate having at least one metal foil layer adhered thereto, said tape having a transverse width greater than a desired width;
   providing said tape with an indexing means;
   patterning said foil layer to form a desired circuit pattern and a pattern comprising bussing means for electrical connection to said circuit pattern, said bussing means including at least one longitudinally extending buss being located between said indexing means and a longitudinally extending edges of said substrate;
   electroplating said patterned foil layer with a desired metal, said electroplating step including electrical connection to said buss means; and
   reducing the width of said tape to said desired width by removing an excess portion of said tape containing said longitudinally extending foil buss, said indexing means remaining essentially intact.

10. A process as in claim 9 wherein said longitudinally extending foil buss is provided closely adjacent to each longitudinally extending edge of said substrate and wherein said removing step is adapted to remove each of said longitudinally extending busses to provide said tape of desired width.

11. A process as in claim 10 wherein said circuit pattern comprises a tape automated bonding format for connecting an electronic device to a leadframe, or electronic package contacts, or a printed circuit board.

12. A process as in claim 11 wherein said tape includes a plurality of said tape automated bonding format circuit patterns arranged in spaced-apart fashion longitudinally of said tape.

13. A process as in claim 9 wherein said at least one longitudinal buss is located within about 0.1 inches of said longitudinally extending edge of said substrate.

14. A process as in claim 13 wherein said starting tape further comprises at least one row of sprockets arranged adjacent said longitudinal edge of said substrate and wherein said longitudinally extending buss is located between said row of sprockets and said longitudinally extending edge of said substrate.

15. Process as in claim 14 wherein a row of said sprockets is located adjacent each outer longitudinally extending edge of said substrate and wherein a longitudinally extending foil buss is located between each such edge of said substrate and its adjacent row of said sprockets.

16. A process for manufacturing a flexible tape having a tape automated bonding format, comprising;

providing a starting tape comprising a non-metallic flexible substrate having at least one metal foil layer adhered thereto, said tape having a transverse width greater than a desired width;

patterning said foil layer to form a plurality of desired tape automated bonding circuit patterns including a plurality of leads extending in cantilever fashion over an aperture in said non-metallic flexible substrate arranged in a spaced-apart fashion longitudinally along said tape and a said pattern further comprising bussing means for electrically connecting to said circuit pattern, said bussing means including at least one longitudinally extending buss, each said longitudinally extending buss being located closely adjacent to a longitudinally extending edge of said substrate;

electroplating said patterned foil layer with a desired metal, said electroplating step including electrical connection to said buss means; and reducing the width of said tape to said desired width by removing an excess portion of said tape containing said longitudinally extending foil busses thereby electrically isolating said leads enabling an electronic device connected to said leads to tbe tested after connection.

* * * * *